(12) United States Patent
Gupta et al.

(10) Patent No.: US 7,398,500 B1
(45) Date of Patent: Jul. 8, 2008

(54) NETLIST SYNTHESIS AND AUTOMATIC GENERATION OF PC BOARD SCHEMATICS

(75) Inventors: Nagesh Chandrasekaran Gupta, Andhra Pradesh (IN); Bhupesh Bharde, Andhra Pradesh (IN); Qamar Alam, Andhra Pradesh (IN); Subramaniam Kaitharam, Andhra Pradesh (IN); Avik Chakraborty, Andhra Pradesh (IN)

(73) Assignee: Taray Technologies, Ameerpet Hyderabad (IN)

( * ) Notice: Subject to any disclaimer, the term of this patent is extended or adjusted under 35 U.S.C. 154(b) by 341 days.

(21) Appl. No.: 11/242,151

(22) Filed: Sep. 30, 2005

(51) Int. Cl.
*G06F 17/50* (2006.01)
*H03K 19/00* (2006.01)

(52) U.S. Cl. .............................. 716/15; 716/14; 716/16; 716/17

(58) Field of Classification Search .............. 716/14–17
See application file for complete search history.

(56) References Cited

U.S. PATENT DOCUMENTS

| 5,414,638 | A | * | 5/1995 | Verheyen et al. | ............... | 716/16 |
| 5,877,942 | A | * | 3/1999 | Kida et al. | ................... | 361/777 |
| 6,530,069 | B2 | * | 3/2003 | Jennion et al. | ................ | 716/15 |
| 2002/0004931 | A1 | * | 1/2002 | Stralen | ........................ | 716/18 |
| 2006/0090152 | A1 | * | 4/2006 | Lin et al. | ....................... | 716/11 |

* cited by examiner

*Primary Examiner*—Vuthe Siek
*Assistant Examiner*—Magid Y Dimyan
(74) *Attorney, Agent, or Firm*—Osha Liang LLP

(57) ABSTRACT

A computer implemented method and system for automatically generating a net list for a printed circuit board are described. Selection of one or more pins on a first and second component to be connected is based on one or more of a logical definition, an electrical definition, a distance property, and a programmable constraint. Once pins of the first and second connections are selected and connected, a net list is automatically generated. The net list includes information associated with the first component, information associated with the second component and at least one pin of the second component.

14 Claims, 9 Drawing Sheets

NETLIST SYNTHESIS AND AUTOMATIC GENERATION OF PC BOARD SCHEMATICS

BACKGROUND

A printed circuit (PC) board provides a surface to mount and interconnect electronic components without discrete wires. In general, a PC board consists of an insulating sheet onto which conductive paths are printed. The insulating sheet, also referred to as the substrate, is often composed of fiberglass-reinforced epoxy composite. The printed conductive paths, also referred to as traces, are often composed of copper. After the PC board has been manufactured, electronic components are mounted on the substrate and attached to the traces usually by soldering. As PC boards are rugged, inexpensive, and highly reliable, they are used extensively in many types of electronic equipment and systems.

There are many different types of electronic components that can be mounted and interconnected using a PC board. Examples of such electronic components include memory chips, transistors, resistors, processor chips, and field programmable gate arrays (FPGA). An FPGA is a large-scale integrated circuit that can be programmed and re-programmed after it is manufactured. Thus, an FPGA is an example of an electronic component that is not limited to a predetermined, unchangeable hardware function.

A pin often serves as a connection point to an electronic component. In other words, when connecting two electronic components together, it is a pin of the first electronic component that is being connected (e.g., via a copper trace) to a pin of the second electronic component. An electronic component may have any number of pins. Some electronic components have fewer than a dozen pins. Some electronic components, an FPGA for example, may have over 1,000 pins.

Each pin of an electrical component has both an electrical definition and a logical definition that must be observed when connecting the pin. The electrical definition indicates voltage ranges, current ranges, frequency ranges, rise times, fall times and other electrical properties well known in the art under which the pin and portion of the electronic component associated with the pin are designed to operate. Failure to observe an electrical definition may result in undesirable performance and even damage to the electronic component. The logical definition of a pin indicates the function of the pin. For example, the pin may be a signal input pin, a signal output pin, a data pin, an address pin, a clock input pin, a power pin, a configure pin, or another type of pin well known in the art. Pins may be connected based on both the electrical definition and the logical definition. Clearly, a signal input pin on a first electronic component should not be connected to a signal input pin on a second electronic component. Likewise, a pin restricted to an operating frequency of less than 10 MHz should not be connected to a pin that outputs or requires a signal with a frequency exceeding 200 MHz.

Although it is possible for a pin of an electronic component to be functionally isolated from other pins of the same electronic component, some pins of an electronic component may be closely related. For example, numerous pins may be grouped as an address bus or a data bus. In addition to the electrical definition and logical definition that must be observed, a group of closely related pins may have additional connection requirements. For example, a group of closely related pins may require the connections (e.g., copper traces) made to each pin in the group be similar in length. Those skilled in the art can appreciate that other connection requirements may also exist.

Prior to the manufacture of a PC board, all the electronic components and interconnections between the electronic components must be determined. The electronic components and connections between the electronic components are stored in a file known as a net list file. Once a net list file exists and is complete, a PC board can be manufactured based on the net list file. Visual outputs, such as schematics, can also be constructed based on the net list file.

SUMMARY

A computer implemented method of generating a net list for a printed circuit board includes selecting a first component from a component library wherein the first component has a plurality of pins, and selecting a second component from the component library, second component having a plurality of programmable pins. At least one of the programmable pins of the second component is selected to electrically connect to at least one pin of the first component. That selection of at least one second component pin is based on at least one of a logical definition, an electrical definition, a distance property, and a programmable constraint. A net list is then automatically generated which includes information associated with the first component, information associated with the second component and the at least one of the plurality of pins of the second component.

A system for generating a netlist includes a component library having a plurality of components associated with a printed circuit board, and a user interface configured to access the component library and select components from the component library. The system further includes a connection module configured to connect at least two components using at least two connections. At least one connection is based on one or more of an electrical definition, a logical definition, a distance property, and a programmable constraint. Finally, the system includes a netlist generator configured to generate a netlist including the components and the connections.

Other aspects of the invention will be apparent from the following description and the appended claims.

DETAILED DESCRIPTION

Figure 1:
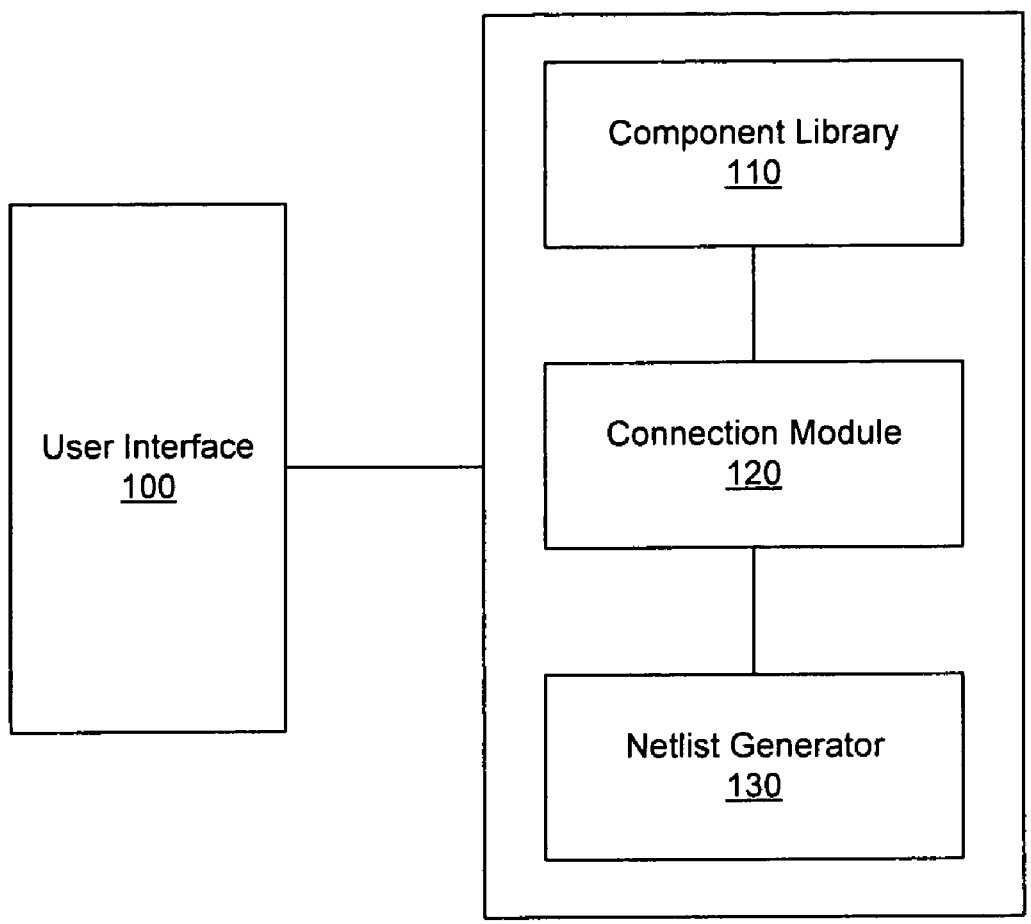
FIG. 1 is a system in accordance with one embodiment of the invention.

Exemplary embodiments of the invention will be described with reference to the accompanying drawings. Like items in the drawings are denoted by the same reference numbers throughout the figures for consistency.

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid overcomplicating this disclosure.

As discussed above, there are many different types of electronic components that can be mounted and interconnected using a PC board. One example of such an electronic component is an FPGA. An FPGA is a large-scale integrated circuit that can be programmed and re-programmed after it is manufactured. Thus, an FPGA is also an example of an electronic component that is not limited to a predetermined, unchangeable hardware function.

An FPGA may have more than 1,000 pins. Although some pins of an FPGA have preset, unchangeable functions (e.g., power pin, ground pin, configure pin, etc.), many of the pins are programmable. These preset pins are all examples of signal type based programming constraints. Further, some pins may be capable of operating with a variety of electrical definitions. For example, the "logic high voltage" may be part of an electrical definition. This value may be +2.5V in the case of one electronic component, and +5V in the case of a different electronic component. A pin of an FPGA may be programmed to operate with either standard. Accordingly, FPGAs may be very flexible.

Pins of an FPGA are often grouped into banks. It may be desirable to connect a group of signals to a single bank. There may be banks of different sizes (i.e., different number of pins) on the same FPGA. In some cases, it may be desirable not to connect every pin of a bank due to power constraints and other factors well known in the art. Accordingly, a bank utilization value may be set to limit the number of pins that can be connected in a single bank. For example, a bank utilization value of 75% indicates that at most 75% of the pins of a bank may be connected.

FIG. 1 shows a system in accordance with one embodiment of the invention. FIG. 1 shows a User Interface (100), a Component Library (110), a Connection Module (120), and a Netlist Generator (130). The User Interface (100) is operatively connected to the Component Library (110), the Connection Module (120), and the Netlist Generator (130). In a similar fashion the Component Library (110), the Connection Module (120), and the Netlist Generator (130) are operatively connected with each other.

Component Library (110) stores information regarding electronic components available to be used on a PC board. In one embodiment of the invention, Component Library (110) may be implemented as a database. Each electronic component in Component Library (110) may have a visual representation (i.e., a symbol) and package information (e.g., package dimensions, pin locations, pin sizes, pin labels, etc.). Component Library (110) may also store an electrical definition and a logical definition for each pin of each electronic component. Component Library (110) may also store information regarding pin groups for each electronic component. Information regarding each electronic component stored in Component Library (110) may be provided as component specific files. In other words, each electronic component in Component Library (110) may be associated with one or more files. In one embodiment, the component package dimensions, the pin sizes, and the pin locations on the component package are provided by a component specific physical file. In one embodiment, pin groups, the logical definition of each pin, and the electrical definition of each pin are provided by a component specific architecture file. In one embodiment of the invention, the physical file and the architecture file are written using XML. In one embodiment of the invention, adding an electronic component to the Component Library (110) involves supplying the physical file and the architecture file associated with the new electronic component.

Connection Module (120) contains the functionality necessary to make connections between electronic components. Connection Module (120) is operatively connected to Component Library (110) and may be configured to use the information regarding each electronic component stored in Component Library (110) to connect electronic components. In one embodiment, Connection Module (120) and Component Library (110) is a single module.

Netlist Generator (130) may be used to generate a net list for a PC board once Connection Module (120) has finished interconnecting electronic components. In one embodiment, the net list resulting from Netlist Generator (130) may be an EDIF net list which is well known in the art.

User Interface (100) provides a means for a user (not shown) to access Component Library (110), Connection Module (120), and Netlist Generator (130). In one embodiment of the invention, User Interface (100) is a graphical user interface. User Interface (100) provides an interactive canvas which represents a PC board to be manufactured. Accordingly, electronic components shown on the canvas are displayed to scale. Information for generating the display of an electronic component (e.g., pin size, pin location, package size, etc.) may be found in the physical file associated with the electronic component. The user (not shown) may place and rotate electronic components selected from Component Library (110) on the canvas and then may use Connection Module (120) to connect the electronic components. Once the Connection Module (120) has completed the connections, the user may use Netlist Generator (130) to generate a net list containing all the electronic components on the canvas and the connections of the electronic components.

Figure 2:
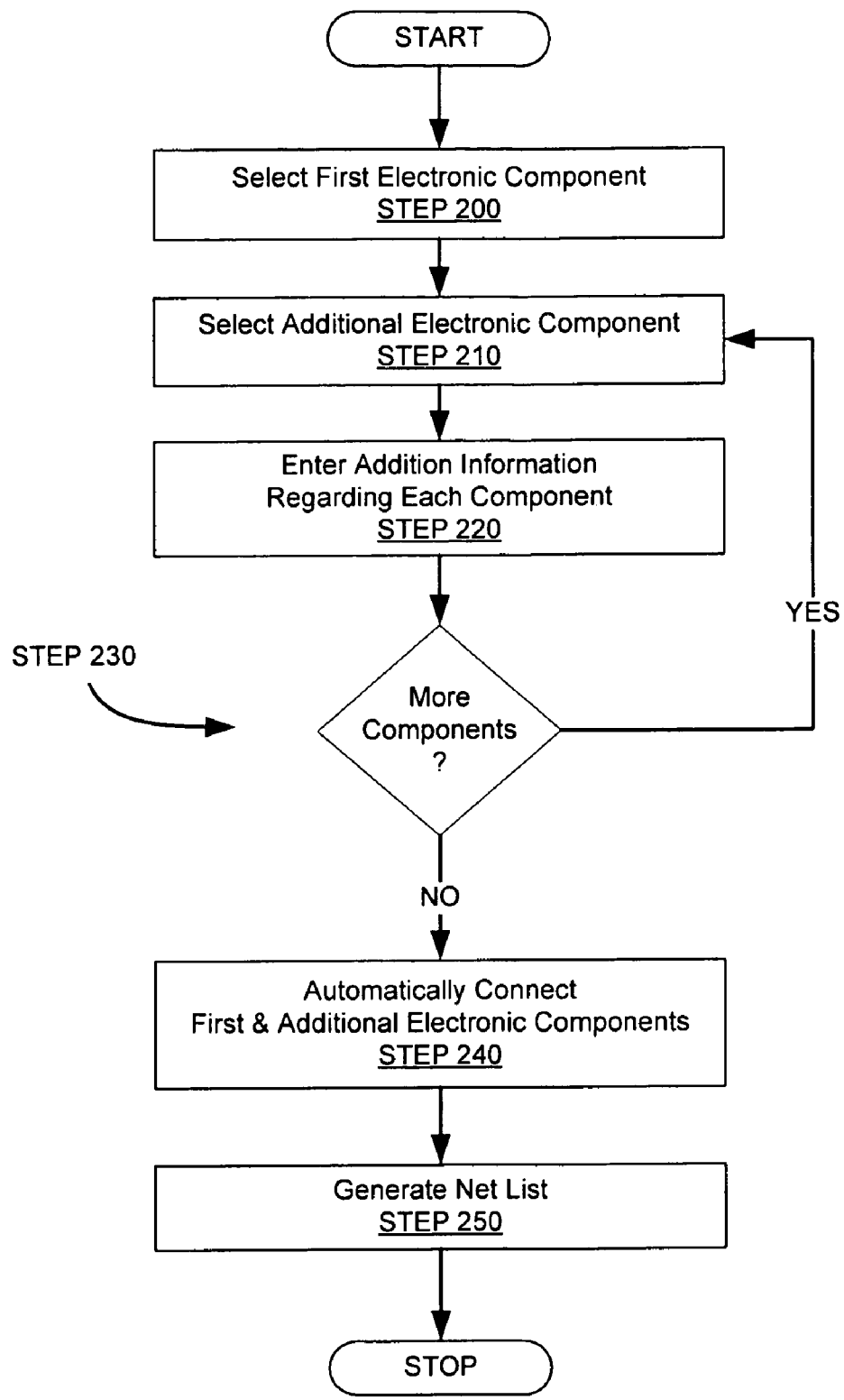
FIG. 2 is a flowchart showing operation of the system in accordance with one embodiment of the invention.

FIG. 2 shows a flowchart in accordance with one embodiment of the invention. In STEP 200, the user selects a first electronic component. This component may be selected from Component Library (110) and placed on the interactive canvas, or may be selected from one of the electronic components already present on the canvas. In STEP 210, the user selects an additional electronic component to connect to the first electronic component. As before, the additional electronic component may be selected from Component Library (110) and placed on the interactive canvas, or may be selected from one of the electronic components already present on the canvas.

In STEP 220, the user is given the option of providing additional information regarding either of the first selected electronic component (STEP 200) or the additional electronic component (STEP 210). This additional information may be additional logic definitions, electrical definitions, pin groupings, package and/or pin sizes, or any other information or options that are not specifically set forth in the files associated with either of the electronic components. This additional information may also include priorities for different constraints (discussed below).

Still referring to FIG. 2, in STEP 230, the user is prompted for additional electronic components to connect. If there are more electronic components to connect, the process repeats itself and returns to STEP 210. Once all the electronic components have been selected, in STEP 240, the Connection Module (120) is used to automatically connect the first selected electronic component (STEP 200) and the additional electronic component (STEP 210) based on the information contained in Component Library (110) and the information entered by the user (STEP 220).

Figure 3:
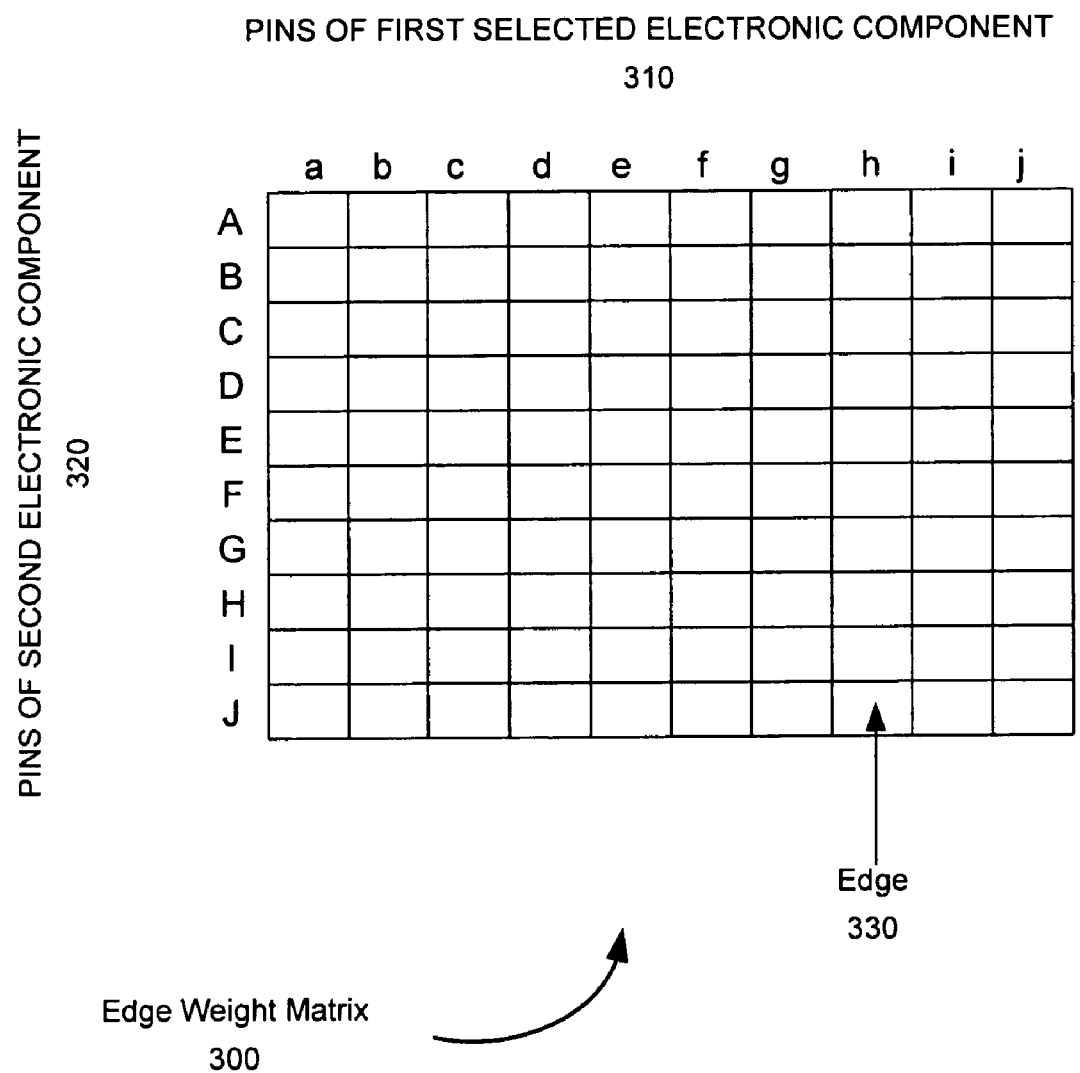
FIG. 3 is an Edge Weight Matrix in accordance with one embodiment of the invention.

In one embodiment of the invention, Connection Module (120) automatically determines the connections between a first selected electronic component and a second selected electronic component using an edge weight matrix. FIG. 3 shows an example edge weight matrix in accordance with one embodiment of the invention. The columns of Edge Weight Matrix (300) represent the pins of the first selected electronic component (310). The rows of Edge Weight Matrix (300) represent the pins of the second selected electronic component (320). Those skilled in the art will appreciate other layouts are possible. An intersection of a row and a column is known in the art as an edge. An edge represents a connection between a pin of the first selected electronic component and a pin of the second electronic component. The values of the edges in Edge Weight Matrix (300) range between a finite lower limit and a finite upper limit. In one embodiment of the invention, the values of the edges in an edge weight matrix are short integers, and the finite lower limit and finite upper limit are the lower and upper extremes respectively, of the short integer range.

In one example, when a row or column of an edge weight matrix is populated, Connection Module (120) will select the edge with the smallest value. In other words, the most desirable edges have values equivalent to the finite lower limit, while the least desirable edges have values equivalent to the finite upper limit. In one embodiment of the invention, if there are two or more edges with the same smallest value, one is chosen at random. In one embodiment of the invention, once the edge with the smallest value is selected, all other edge values in the entire row and the entire column containing the selected edge value are set to the finite upper limit.

In a second example, the high and low representations are swapped. Thus, the most desirable edges are those having values equivalent to the finite upper limit, and the least desirable edges have values equivalent to the finite lower limit.

Figure 4:
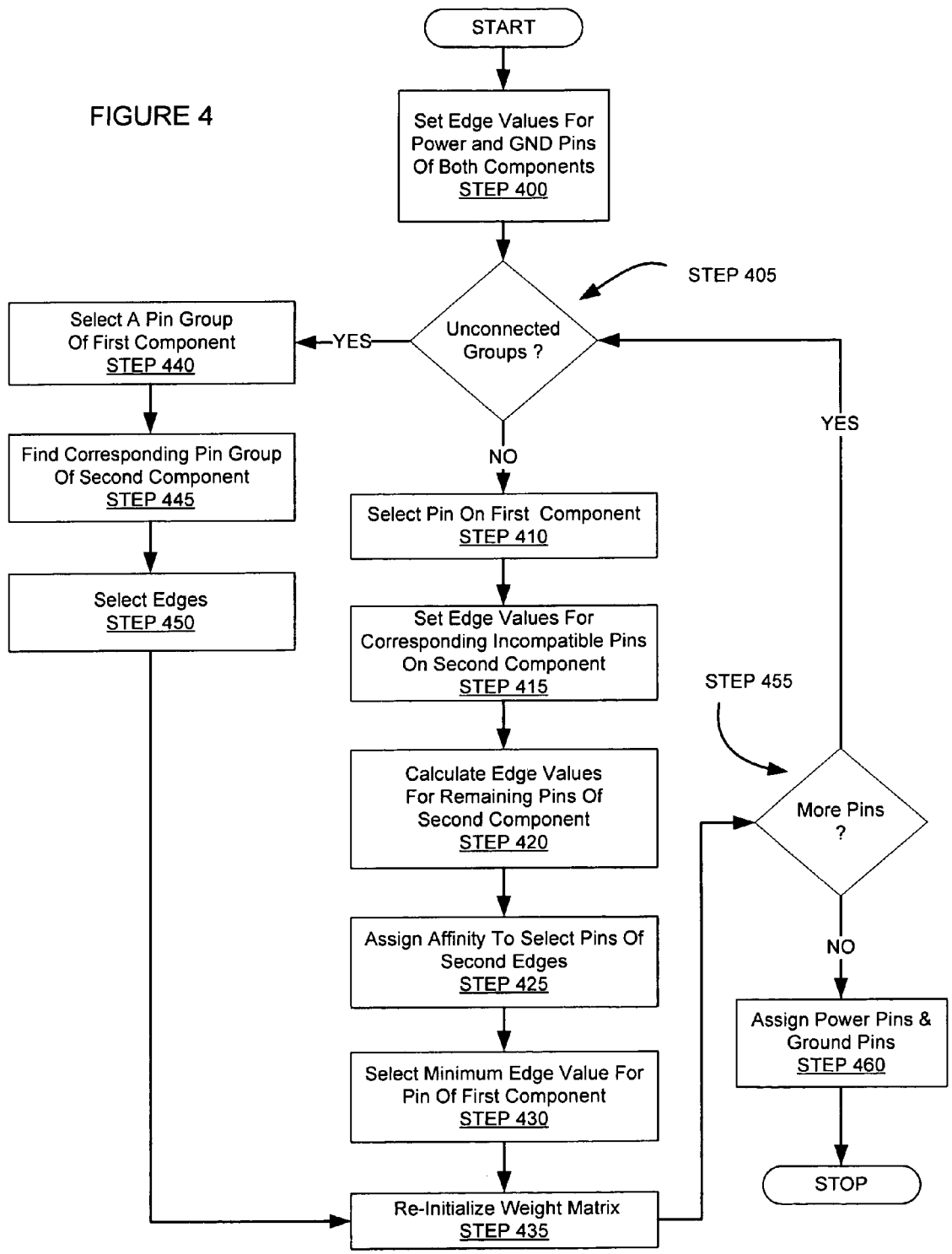
FIG. 4 is a flowchart showing operation of the Connection Module in accordance with one embodiment of the invention.

FIG. 4 shows a flowchart in accordance with one embodiment of the invention. In this embodiment, Connection Module (120) is connecting a first electronic component and a second electronic component where neither component has programmable pins. In STEP 400, the edge values for all power and ground pins of both the first electronic component and the second electronic component are set to the finite upper limit of the edge weight matrix. In STEP 405, a determination is made whether the first electronic component has any pin groups that have not yet been connected. If there are no unconnected pin groups, a pin is selected on the first electronic component (STEP 410). The selected pin on the first electronic component (STEP 410) must not yet be connected to the second electronic component, and must be neither a power pin nor a ground pin. In one embodiment of the invention, the pin on the first electronic component is selected at random from the pins meeting the criteria set forth above. In STEP 415, pins of the second electronic component that cannot be connected to the selected pin of the first electronic component because they violate electrical definitions and/or logical definitions are assigned a corresponding edge value equal to the finite upper limit of the edge weight matrix, and are excluded from any further calculations involving the selected pin of the first electronic component. Connection Module (120) may access the architecture files associated with the first electronic component and the second electronic component in Component Library (110) to assess which pins correspond to power and ground, which pins belong to groups, and which pins are incompatible and thus, cannot be connected because they violate electrical definitions and/or logical definitions.

Still referring to FIG. 4, in STEP 420 edge values to the corresponding compatible pins of the second electronic component are calculated based on priorities and constraints (discussed below). In STEP 425, affinity values may be assigned to select edges corresponding to the selected pin (STEP 410). Those skilled in the art will appreciate in some instances, following calculation of edge values (STEP 420), numerous edge values may be identical despite only a few of the edges being ideal. In other words, although numerous edges may have an identical smallest edge value, only a fraction of those edges represent the best connections. This situation may arise, for example, in the case of clock pins and differential pins. In such cases, an affinity factor is subtracted from the edges representing the best connections to ensure they have the lowest edge value. Thus, one of the desired edges (based on the affinity factors) will be selected as the connection. In one embodiment of the invention, the affinity factor is defined as the difference between the largest edge value and the smallest edge value for the selected pin. In STEP 430, an edge with the minimum value for the selected pin is chosen as the best connection. In one embodiment of the invention, the selected edge and the two pins it connects are stored in a data structure, such as a linked list.

Still referring to FIG. 4, at STEP 405 a determination is made whether the first electronic component has any pin groups that have not yet been connected. If unconnected pin groups do exist, in STEP 440, a pin group of the first component is selected. A pin group may be, for example, an address bus or a data bus. In one embodiment of the invention, the pin group is chosen at random. In one embodiment of the invention, a pin group with the fewest number of pins is selected first. In one embodiment of the invention, a pin group with the greatest number of pins is selected first.

In STEP 445, Connection Module (120) locates a corresponding pin group on the second component. Locating a corresponding pin group is accomplished by examining the pin groups of the second electronic component and determining which of the choices would be compatible with both the logic definition and electrical definition of each pin in the pin group of the first electronic component, in addition to any additional requirements specified by the user (FIG. 2, STEP 220). Connection Module (120) may access the architecture files associated with the first electronic component and the second electronic component in Component Library (110) to assess the electrical definitions and logical definitions of the pins in the group, and properties of the group itself. In STEP 450, the edges and the pin groups they connect are stored in a data structure, such as a linked list. In STEP 435, the edge weight matrix is re-initialized. In one embodiment of the invention, re-initializing the edge weight matrix involves setting the edge value of every connected pin and every edge in the same row and column as a connected pin to the finite upper limit. In STEP 455, the edge weight matrix is examined for any unconnected pins. In one embodiment of the invention, the presence of at least one edge value that is less than the finite upper limit indicates there is at least one unconnected pin. If unconnected pins exist, the process returns to STEP 405. If all the pins are connected, the process proceeds to STEP 460 to assign proper connections to the power and ground pins of both the first and second electronic components. In one embodiment of the invention, these connections are to the power supply and ground line of the PC board as needed.

Figure 5:
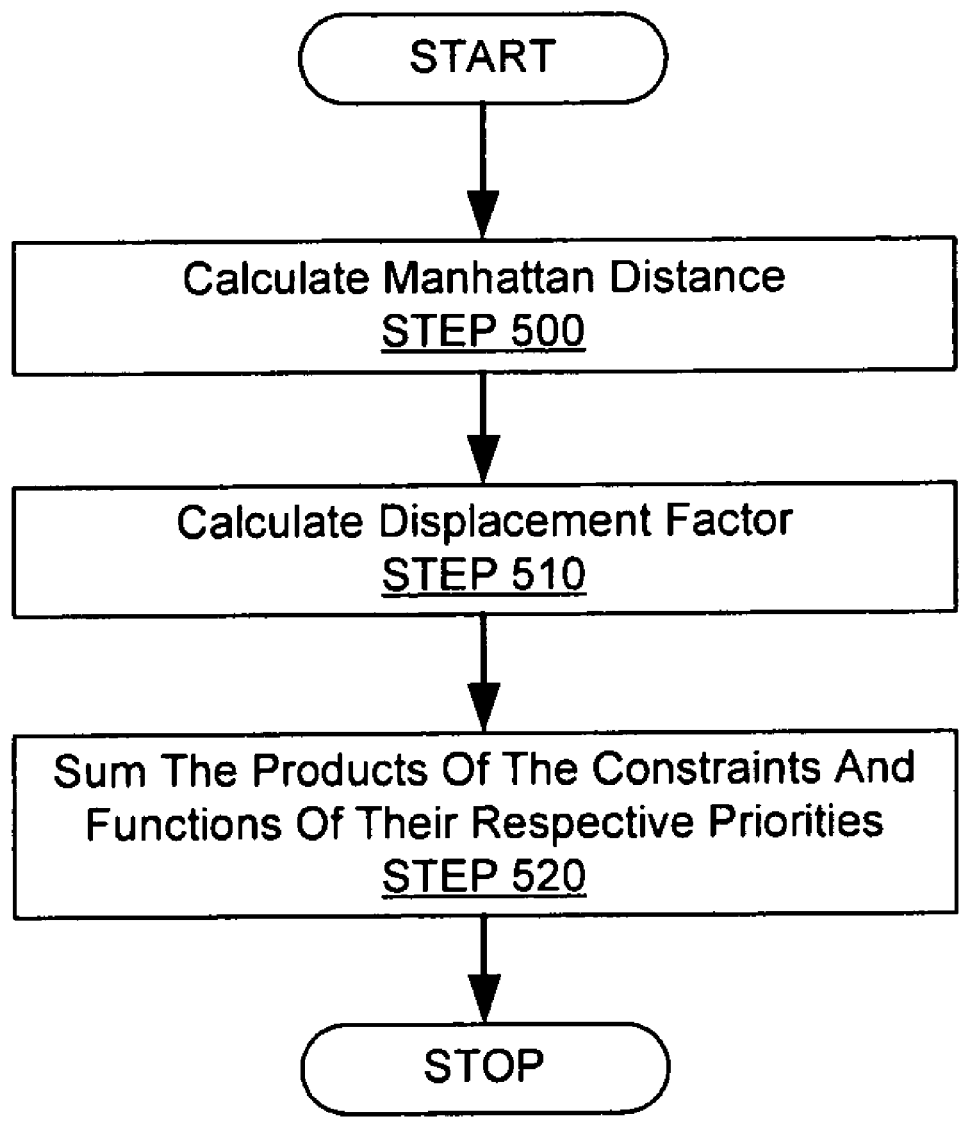
FIG. 5 is a flowchart showing the calculations involving priorities and constraints in accordance with one embodiment of the present invention.

As mentioned above, in STEP 420, edge values correspond to the compatible unconnected pins of the second electronic component are calculated based on priorities and constraints. FIG. 5 shows a flowchart detailing the calculations involving priorities and constraints for a given edge in accordance with one embodiment of the invention. In STEP 500, the Manhattan distance of the edge is determined based upon the locations of the pins on the canvas. Those skilled in the art will appreciate other distance properties may be used. The position of each pin for use in the Manhattan distance calculation may be stored in the Component Library (110) in the physical file for the corresponding electronic component. In STEP 510, the displacement factor is calculated for the edge. The displacement factor is associated with a connection's deviation from a straight line. Pins of an electrical component may be arranged in a grid format on the electrical component. The row and column of each pin may be stored in the Component Library (110) in the physical file for the electronic component. Let $\{r_f, c_f\}$ be the row number and column number respectively of the selected pin on the first electronic component. Let $\{r_s, c_s\}$ be the row number and column number respectively of the pin on the second electronic component. In one embodiment of the invention, the displacement factor is given by:

$$\text{Displacement factor} = (|r_s - r_f| + 1) \times (|c_s - c_f| + 1) - 1.$$

In STEP 520, the product of the Manhattan Distance and a function of its priority and the product of the Displacement Factor and a function of its priority are summed to produce the edge value. As discussed above (FIG. 2, STEP 220), the priority values are provided by the user. The priority values assign significance to the constraints such as the Manhattan Distance and the Displacement factor. In one embodiment of the invention, the priority values provided by the user are natural numbers, where the greater the number, the greater the importance. A function takes the priority value provided by the user and maps each priority value to a value suitable for use in the edge value calculation. In one embodiment, the priority value is not mapped but is used directly.

Figure 6:
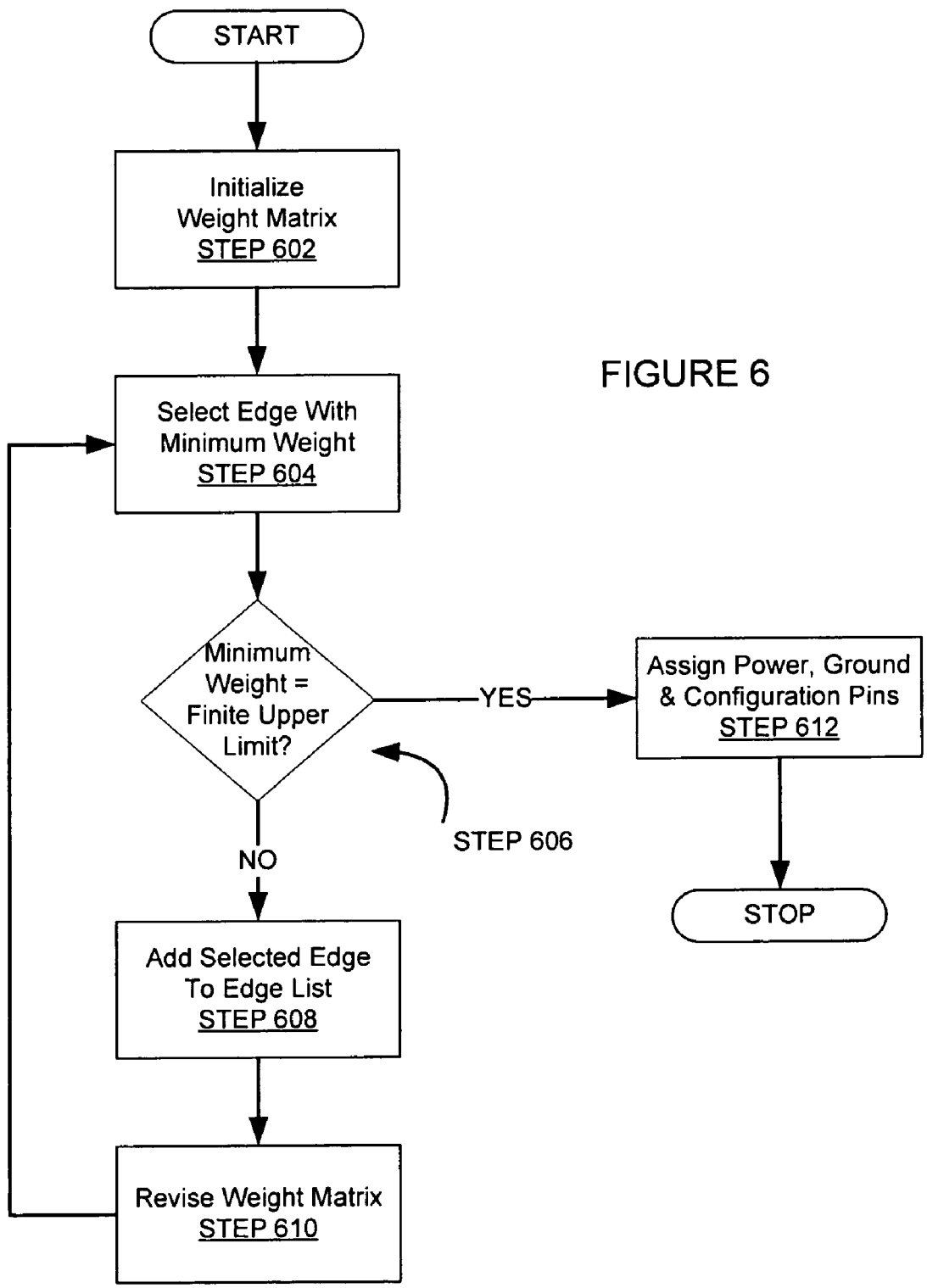
FIG. 6 is a flowchart showing operation of the Connection Module in accordance with one embodiment of the present invention.

FIG. 6 shows a flowchart in accordance with one embodiment of the invention. In this example, Connection Module (120) is connecting a first electronic component and a second electronic component where the second component has programmable pins, such as an FPGA. In STEP 602, an edge weight matrix for the first electronic component and second electronic component is initialized (discussed below). During the initialization process, a value is assigned to each edge of the edge weight matrix.

In STEP 604, the edge with the smallest value in the edge weight matrix is selected. If there is more than one edge with the smallest value, one of the smallest valued edges is selected at random. In STEP 606, a determination is made if the selected edge has a value equal to the finite upper limit. If the selected edge does not have a value equal to the finite upper limit, the selected edge and its corresponding pins are added to an edge list (STEP 608).

In STEP 610, the edge weight matrix is re-initialized. STEP 610 is very similar to STEP 435 of FIG. 4 except that in STEP 610, banks of the second component which have reached their respective utilization factors have the edges corresponding to all remaining unconnected pins set to the finite upper limit of the edge weight matrix. Following re-initialization (STEP 610), STEP 604 is re-visited. If in STEP 606 it is determined the selected edge value (STEP 604) is equal to the finite upper limit, STEP 612 is visited and the power, ground and configuration pins are assigned.

Figure 7:
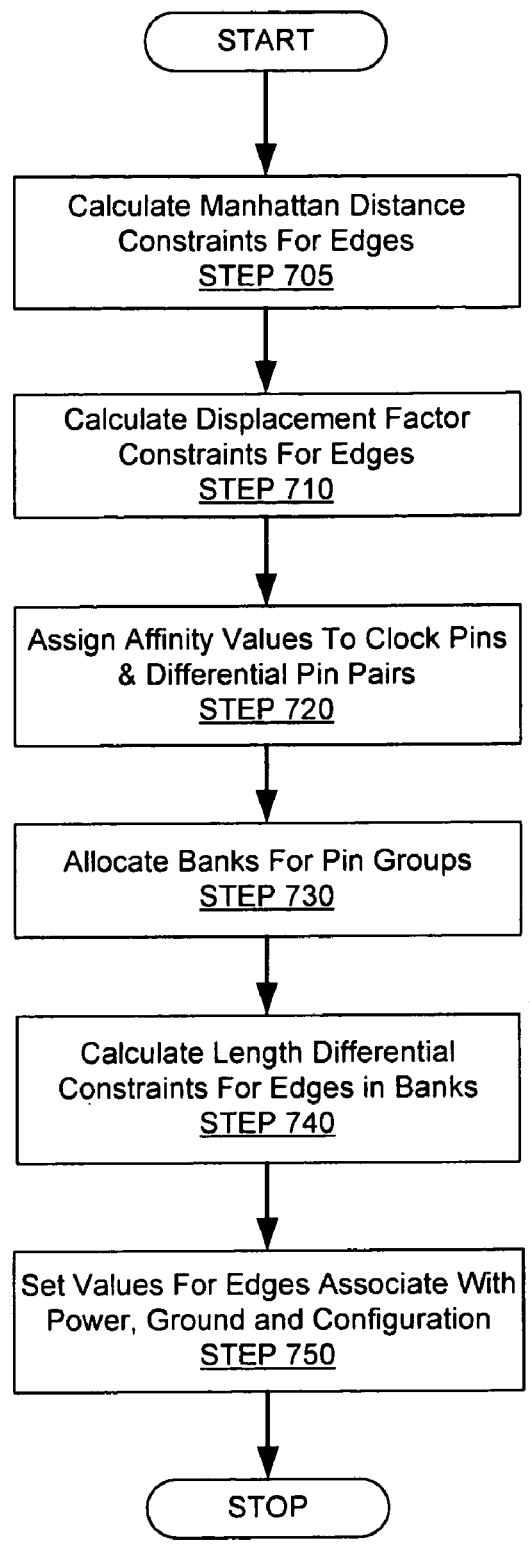
FIG. 7 is a flowchart showing initialization of an edge weight matrix in accordance with one embodiment of the invention.

As mentioned above, in STEP 602 the edge weight matrix is initialized. FIG. 7 is a flowchart regarding the edge weight matrix initialization in accordance with one embodiment of the invention. In STEP 705, the Manhattan Distance of each edge is calculated. This step is very similar to STEP 500 as shown and discussed in FIG. 5. The Manhattan Distance of each edge is then multiplied by a function of the priority value associated with the Manhattan Distance (FIG. 2, STEP 220). These products are placed in the edge weight matrix.

In STEP 710, a Displacement Factor is calculated for each edge. This step is very similar to STEP 510 as shown and discussed in FIG. 5. The Displacement Factor of each edge is then multiplied by a function of the priority value associated with the Displacement Factor (FIG. 2, STEP 220). These products are added to the values already present in the edge weight matrix. In STEP 720, affinity values are assigned to edges associated with clock pins and differential pin pairs. STEP 720 is identical to STEP 425 as shown and discussed in FIG. 4.

In STEP 730, banks of the second electronic component are allocated for pin groups of the first electronic component (discussed below). In one embodiment of the invention, pin groups with the smallest number of pins are allocated banks first. In one embodiment of the invention, pin groups with the greatest number of pins are allocated banks first. In STEP 740, once pin groups have been allocated banks, a length differential is calculated for every edge associated with a bank. In one embodiment of the invention, within each bank, the edge with the largest Manhattan Distance is determined. The length of this edge is denoted $L_{MAX}$. The length differential for a given edge in the bank is then specified as the absolute difference between $L_{MAX}$ and the Manhattan Distance of the edge.

In one embodiment of the invention, within each bank, the average Manhattan Distance of all the edges is determined. This value is denoted $L_{AVG}$. The length differential for a given edge in the bank is then specified as the absolute difference between $L_{AVG}$ and the Manhattan Distance of the edge. In one embodiment of the invention, within each group, the mode of the Manhattan Distance of the edges is denoted $L_{MODE}$. The length differential for a given edge in the bank is specified as $(-1) \times (\text{frequency of } L_{MODE})$. Regardless of which method is used to calculate the length differential for an edge within a bank, the length differential of each edge is multiplied by a function of the priority value associated with the length differential (FIG. 2, STEP 220). The products are added to the values already present in the edge weight matrix. In STEP 750, edges associated with the power, ground and configuration pins are set to the finite upper limit of the edge weight matrix. The Connection Module (115) can access the architecture file associated with each component stored in the Component Library (110) to determine which pins are associated with power, ground and configuration.

Figure 8:
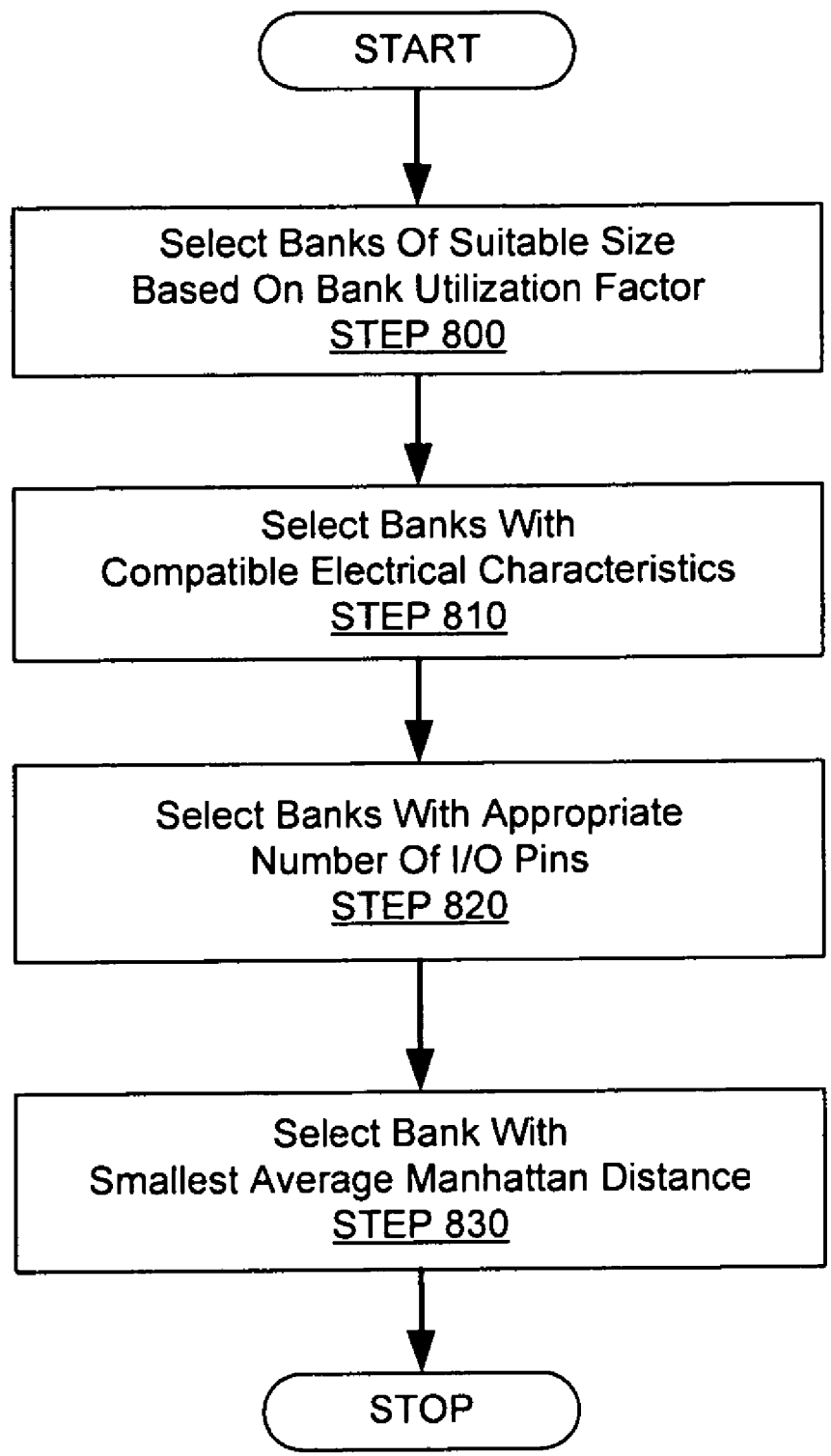
FIG. 8 is a flowchart showing the bank selection process in accordance with one embodiment of the invention.

As mentioned above, in STEP 730 banks of the second electronic component are allocated for pin groups of the first electronic component. FIG. 8 shows a flowchart regarding the bank selection process in accordance with one embodiment of the present invention. In STEP 800, banks with a sufficient number of available pins to connect with the pin group of the first electronic component are selected. This selection may take into account the bank utilization factor. In STEP 810, banks that satisfy the electrical definition of the pin group of the first electronic component are selected from the banks meeting the size criteria (STEP 800). As discussed above, certain programmable devices, some FPGAs for example, have pins that are capable of being programmed to work with numerous electrical definitions.

In general, once a pin is programmed to work with a specific electrical definition, the remaining pins in the bank must also be programmed to work with the same electrical definition. In other words, the electrical definition is consistent for all pins within a bank. An electrical definition is an example of a programming constraint. In STEP 820, banks with the appropriate number of input and output (I/O) pins are selected from the banks chosen in STEP 810.

As discussed above, many pins of an FPGA for example, can be programmed as either an input pin, an output pin or both. However, some pins may be constrained to be either an input or an output. The number and type of I/O pins of the pin group of the first electronic component must match the number and type of I/O pins available in the bank. I/O designation of a pin is an example of a programmable constraint. In STEP 830, the bank with the smallest Manhattan Distance from the group of pins on the first electronic component is chosen to connect with the group of pins. In one embodiment of the invention, the start and stop points for the Manhattan Distance calculation is the average position of the pins of the bank and the average position of the pins forming the group on the first electronic component respectively. In one embodiment of the invention, if more than one bank has an identical smallest Manhattan Distance, one of those banks is chosen at random.

In one embodiment of the invention, the user may manually make one or more connections between two electronic components prior to using the Connection Module (120). In one embodiment of the invention, the user may manually edit one or more connections between two electronic components following the use of the Connection Module (120).

Once the Connection Module (120) has completed all the necessary connections and there are no more electronic components to connect, the Netlist Generator (130) may be invoked by the user to generate a net list file. In one embodiment of the invention, once the net list file is generated, schematic drawings of the PC Board, including electronic components and connections, can be generated using the symbols of the electrical components stored in the Component Library (110) and any of the techniques well known in the art. In one embodiment of the invention, once the net list file is generated, the PC board may be manufactured using the net list file and any of the techniques well known in the art.

Figure 9:
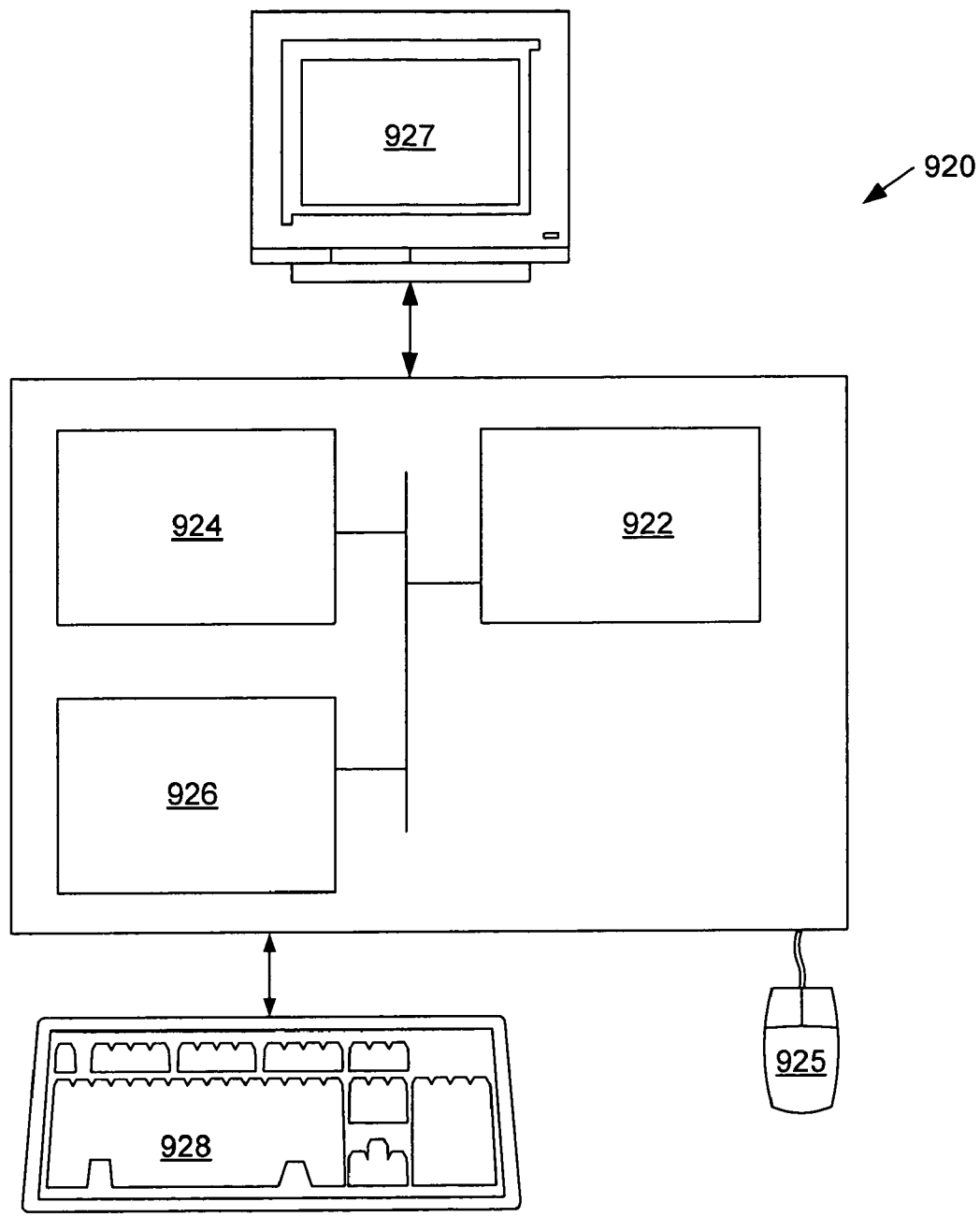
FIG. 9 is a typical computer system in accordance with one embodiment of the invention.

The invention may be implemented on virtually any type computer regardless of the platform being used. For example, as shown in FIG. 9, a typical computer (920) includes a processor (922), associated memory (924), a storage device (926), and numerous other elements and functionalities typical of today's computers (not shown). The computer (920) may also include input means, such as a keyboard (928) and a mouse (925), and output means, such as a monitor (927). Those skilled in the art will appreciate that these input and output means may take other forms in an accessible environment.

Embodiments of the invention may have one or more of the following advantages. The invention provides the user with a time-saving tool capable of correctly and automatically connecting electronic components on a PC board. The invention provides a net list for a PC board that is optimized to minimize the number of layers to manufacture the PC board.

Computer code implementing the methods presented in this disclosure may be stored in memory within a computer, or may alternatively be stored in more permanent computer readable medium such as hard drives, optical disks, compact disks, and magnetic tape. Further, such code may be transferred over communications networks with or without a carrier wave.

Software instructions to perform embodiments of the invention may be stored on a computer readable medium such as a flash memory, compact disc (CD), hard disk drive, diskette, a tape, or any other computer readable storage device.

While the invention has been described with respect to a limited number of embodiments, one skilled in the art, having benefit of this disclosure, can appreciate that other embodiments can be devised which do not depart from the scope of the invention as disclosed herein. Accordingly, the scope of the invention should be limited only by the attached claims.

The invention claimed is:

1. A computer implemented method of generating a net list for a printed circuit board comprising:
    selecting a first component from a component library wherein the first component comprises a plurality of pins;
    selecting a second component from the component library, wherein the second component comprises a plurality of programmable pins;
    automatically selecting a first pin of the plurality of programmable pins of the second component to electrically connect to a second pin of the plurality of pins of the first component, wherein the selection is based on at least one selected from the group consisting of a logical definition, an electrical definition, a distance property, and a programmable constraint; and
    automatically generating the netlist, wherein the netlist comprises information associated with the first component, information associated with the second component and information associated with the at least one of the plurality of pins of the second component.

2. The method of claim 1, wherein the programmable constraint comprises at least one selected from the group consisting of a voltage range restriction, a frequency range restriction, a current range restriction, a fall time restriction, and a rise time restriction.

3. The method of claim 1, wherein the programmable constraint is based on a signal type.

4. The method of claim 1, wherein the electrical definition comprises at least one selected from the group consisting of a voltage range, a frequency range, a current range, a fall time, and a rise time.

5. The method of claim 1, wherein the logical definition comprises at least one selected from the group consisting of an input pin, an output pin, a clock pin, a data pin, an address pin, and a bus membership.

6. The method of claim 1, wherein the distance property comprises at least one selected from the group consisting of a Manhattan length, a displacement factor, and a length differential.

7. The method of claim 1, wherein selecting the first component further comprises receiving input comprising at least one selected from the group consisting of an electrical definition and a logical definition for a pin of the first component.

8. The method of claim 1, wherein the selection of both the first component and second component is done with a GUI.

9. The method of claim 1, further comprising:
    automatically generating a schematic from the netlist.

10. A system for generating a printed circuit board netlist comprising:
    means for selecting a first component from a component library wherein the first component comprises a plurality of pins;

means for selecting a second component from the component library, wherein a plurality of pins of the second component are programmable;

means for automatically selecting at least one of the plurality of programmable pins of the second component to electrically connect to a second pin of the plurality of pins of the first component, wherein the selection is based on at least one selected from the group consisting of a logical definition, an electrical definition, a distance property, and a programmable constraint and optimizes at least one from the group comprising number of layers and an electrical distance; and a netlist generator for automatically generating the netlist comprising the first component, the second component and the at least one of the plurality of pins of the second component.

11. The system of claim 10 wherein the means for selecting a first component from a component library comprises a user interface.

12. The system of claim 10 wherein the means for selecting a second component from the component library comprises a user interface.

13. The system of claim 10 wherein the means for selecting at least one of the plurality of pins of the second component to electrically connect to the first component comprises a connection module configured to automatically connect a plurality of components.

14. A computer readable medium comprising computer executable software instructions which when executed by a processor performs a method comprising:

selecting a first component from a component library wherein the first component comprises a plurality of pins;

selecting a second component from the component library, wherein the second component comprises a plurality of programmable pins;

automatically selecting a first pin of the plurality of programmable pins of the second component to electrically connect to a second pin of the plurality of pins of the first component, wherein the selection is based on at least one selected from the group consisting of a logical definition, an electrical definition, a distance property, and a programmable constraint; and automatically generating the netlist, wherein the netlist comprises information associated with the first component, information associated with the second component and information associated with the at least one of the plurality of pins of the second component.

* * * * *